United States Patent [19]
Hafizi

[11] Patent Number: 5,729,033
[45] Date of Patent: Mar. 17, 1998

[54] FULLY SELF-ALIGNED SUBMICRON HETEROJUNCTION BIPOLAR TRANSISTOR

[75] Inventor: Madjid Hafizi, Santa Monica, Calif.

[73] Assignee: Hughes Electronics, Los Angeles, Calif.

[21] Appl. No.: 740,581

[22] Filed: Oct. 31, 1996

Related U.S. Application Data

[62] Division of Ser. No. 470,811, Jun. 6, 1995, Pat. No. 5,665, 614.

[51] Int. Cl.$^6$ .......................... H01L 29/737; H01L 29/41
[52] U.S. Cl. .......................... 257/198; 257/197; 437/984
[58] Field of Search .......................... 257/197–198; 437/126, 133, 184, 31, 984

[56] References Cited

U.S. PATENT DOCUMENTS

| | | | |
|---|---|---|---|
| 4,967,252 | 10/1990 | Awano | 257/197 |
| 5,001,534 | 3/1991 | Lunardi et al. | 257/197 |
| 5,024,958 | 6/1991 | Awano | 437/31 |
| 5,106,766 | 4/1992 | Lunardi et al. | 437/31 |
| 5,124,270 | 6/1992 | Morizuka | 437/31 |
| 5,270,223 | 12/1993 | Liu | 437/31 |
| 5,298,438 | 3/1994 | Hill | 437/31 |
| 5,389,554 | 2/1995 | Liu et al. | 437/31 |
| 5,434,091 | 7/1995 | Hill | 437/31 |
| 5,445,976 | 8/1995 | Henderson et al. | 437/31 |
| 5,512,496 | 4/1996 | Chau et al. | 437/31 |

FOREIGN PATENT DOCUMENTS

| | | | |
|---|---|---|---|
| 0124465 | 5/1988 | Japan . | |
| 2-98937 | 4/1990 | Japan | 257/198 |
| 3-108399 | 5/1991 | Japan . | |
| 403108339 | 5/1991 | Japan . | |
| 403291942 | 12/1991 | Japan . | |
| 404101431 | 4/1992 | Japan . | |
| 406175225 | 7/1993 | Japan . | |
| 406132297 | 5/1994 | Japan . | |

OTHER PUBLICATIONS

Y. Ueda, et al., "Submicron-Square Emitter AlGaAs/GaAs HBT's with AlGaAs Hetero–Guarding," IEEE Electron Device Letters, vol. 15, No. 2, Feb., 1994, pp. 66–68.

Wong–Seong, Lee, et al. "*Submicrometer Self–Aligned AlGaAs/GaAs Heterojunction Bipolar Transistor Process Suitable for Digital Applications*", IEEE Transactions on Electron Devices, vol. 39, No. 12, Dec., 1992; pp. 2694–2700.

Eda, K. et al. "*Emitter–Base–Collector Self–Aligned Heterojunction Bipolar Transistors Using Wet Etching Process*", IEEE Electron Device Letters, vol. 7, No. 12, Dec., 1986; pp. 694–696.

(List continued on next page.)

*Primary Examiner*—Jerome Jackson
*Assistant Examiner*—John Guay
*Attorney, Agent, or Firm*—V. D. Duraiswamy; W. K. Denson-Low

[57] ABSTRACT

A submicron emitter heterojunction bipolar transistor and a method for fabricating the same is disclosed. The fabrication process includes lattice matched growth of subcollector, collector, base, emitter, and emitter cap layers in sequential order on a semi-insulating semiconductor substrate. An emitter cap mesa, an emitter/base/collector mesa and a subcollector mesa are formed. Dielectric platforms are formed extending the base/collector layers laterally. Sidewalls are formed on the sides of emitter cap mesa and the sides of the extended base/collector layers and undercuts are etched into the emitter layer and the upper portion of the subcollector layer. This forms an overhang on the emitter cap mesa with respect to the emitter layer and an overhang on the base/collector layers with respect to the upper portion of the subcollector layer. Emitter, base and collector contacts are simultaneously formed, the base contact aligned to the edge of the emitter cap overhang and the collector contact aligned to the edge of the base/collector layer overhang.

2 Claims, 13 Drawing Sheets

OTHER PUBLICATIONS

Nagata, K., et al. *"A New Self-Alignment Technology Using Bridged Base Electrode for Small-Scaled AlGaAs/GaAs HBT's"*, IEEE Transactions on Electron Devices, vol. 39, No. 8, Aug., 1992; pp. 1786–1791.

Hayama, N., et al. *"Fully Self-Aligned AlGaAs/GaAs Heterojunction Bipolar Transistors for High-Speed Integrated-Circuits Application"*, IEEE Transactions on Electron Devices, vol. 35, No. 11, Nov., 1988; pp. 1771–1777.

Madihian, et al., *"The Design, Fabrication, and Characterization of a Novel Electrode Structure Self-Aligned HBT with a Cutoff Frequency of 45 Ghz"*, IEEE Transactions on Electron Devices, vol. ED-34, No. 7, Jul., 1987, pp. 1419–1427.

Nakajima, H., et al. *"High-speed InP/InGaAs HBTs operated at submilliampere collector currents"*, Electronics Letters, vol. 29, No. 21, 14th Oct. 1993, pp. 1887–1888.

FULLY SELF-ALIGNED SUBMICRON HETEROJUNCTION BIPOLAR TRANSISTOR

This is a division of application Ser. No. 08/470,811 filed Jun. 6, 1995, now U.S. Pat. No. 5,665,619.

BACKGROUND OF THE INVENTION

1. Field of the Invention

The present invention relates to a heterojunction bipolar transistor (HBT) and more specifically to a submicron emitter HBT with limited parasitics and a fully self-aligned process for fabricating the same.

2. Description of the Related Art

An HBT is a bipolar transistor with at least two adjacent layers of different chemical composition but of similar crystalline structure. Typically, the emitter layer is made of a wider bandgap material than the base to provide an energy barrier for holes flowing from the base to the emitter that is greater than the energy barrier for electrons flowing in the opposite direction. This inhibits the flow of holes into the emitter, allowing for highbase doping and a low base resistance. Also, the emitter can have low doping, resulting in a thick base-emitter depletion layer and low emitter-base capacitance. This improves the emitter efficiency and the current gain of the HBT.

HBTs are generally fabricated by growing lattice matched layers on a semiconductor substrate by molecular beam epitaxy (MBE) or a similar technique. Design variations for each layer include its composition, doping concentration, thickness and defect density. Electrical contacts are made to the emitter, base and collector layers, and the transistor is isolated from the layers outside the transistor region. Typically, a contact is made to the emitter directly from its top surface. To contact the base, the top layers of the transistor are etched and a metal film is deposited directly on the base layer. An alternate method of contacting the base is to change the doping of the structure's top layers by ion implantation of acceptors. Contact to the collector is usually made by etching through the upper epitaxial layers down to a sub-collector layer which is between the substrate and the collector. A contact is then made to the sub-collector. The problem with this method is that a considerable etch depth is required to reach the sub-collector.

It is also necessary to isolate the transistor from other devices on the substrate. This can be done by inducing lattice damage to the layers outside the transistor region through ion-implantation and making them semi-insulating. This however can damage the substrate and ion-implantation technology is not available for all materials. An alternate isolation procedure is to etch the epitaxial layers around the transistor to form a mesa on a semi-insulating substrate. Also, etched gaps at the transistor region's edges can be filled with dielectric or planarizing materials to achieve a planar device.

Parasitic elements associated with an HBT can degrade its speed and increase power consumption. One of the most significant parasitic elements is the extrinsic region base-collector capacitance, which is the space charge layer capacitance between the base and the collector layers extrinsic to the transistor's active region (the active region lies under the emitter and is referred to as the intrinsic region). The device's speed and performance can be improved and its frequency response increased by limiting the size of the extrinsic region and thus limiting its base-collector capacitance. However, it is difficult to eliminate the extrinsic region because it supports the base contact.

There are several well known ways to reduce the HBT dimensions which mainly concentrate on reducing the emitter dimensions. They include defining the emitter dimensions by metal lift-off. There is, however, a limit to how small a feature size can be defined by metal lift-off. Another method includes dry-etching with a dielectric mask to define the minimum feature size. However, this approach requires multiple metalization steps and lift-off or dry etching of the metal layers to define the base and collector ohmic contacts. Furthermore, the collector metal will not be self-aligned to the emitter mesa when using the dry-etching technique.

One specific method of fabricating a self aligned AlGaAs/GaAs HBT is disclosed in Won-Seong Lee et. al., "Submicrometer Self-Aligned AlGaAs/GaAs Heterojunction Bipolar Transistor Process Suitable for Digital Applications", IEEE Transactions On Electron Devices, Vol 39, No. 12, December 1992, pages 2694–2700. The process, after forming a subcollector, collector, base, emitter and emitter cap layer in sequence on a substrate by MBE, includes; a) forming a dummy emitter mesa and an external base by photolithography, b) deposition of a base metal and electron cyclotron resonance (ECR) plasma deposition of oxide, c) removal of the exposed base metals deposited on a sidewall region by ECR plasma deposition of oxide and ECR plasma etching by $NF_3$, d) planarization of the device with a photoresist, e) etch back of the photoresist, and f) defining the emitter metal region. Although this process is claimed to produce a submicrometer AlGaAs/GaAs HBT, it has several problems. Primarily, the process does not produce a fully self-aligned HBT with the collector, base and emitter contacts aligned together. Rather, only the base and emitter are self-aligned. This results in more than one metalization process, increasing the tolerance associated with the metalizations. Furthermore, a thin Ti layer is evaporated and a tungsten layer is sputtered onto P+ GaAs to form the base metal of step b above; this requires a special sputtering system which is expensive. Removal of exposed base metals from the sidewalls using ECR as in step d above also requires expensive and complicated procedures.

SUMMARY OF THE INVENTION

The present invention is for a submicron emitter HBT and an associated fabrication method that provides the HBT with self-aligned emitter, base and collector contacts. The fabrication process is simple, inexpensive, uses established material systems, involves only one metalization step to form contacts to the emitter, base and collector regions and produces a fully self-aligned HBT with limited parasitic elements.

The fabrication process includes the growth of a subcollector layer, collector layer, base layer, emitter layer, and an emitter cap layer in sequential order on a semi-insulating semiconductor substrate that is formed on a wafer surface. Different material systems may be used as long as the layers are lattice matched and the emitter layer semiconductor material is chosen to have a wider bandgap than the base layer semiconductor material to suppress the flow of holes into the emitter.

In a preferred embodiment, an emitter cap mesa is formed by defining the emitter pattern in a thin layer of photoresist, transferring it to the emitter cap and etching the emitter cap layer down to the emitter layer. An emitter/base/collector mesa, wider than the emitter cap mesa, is formed under the emitter cap mesa by etching the emitter, base and collector layers down to the sub-collector. A dielectric, preferably silicon dioxide, deposited over the wafer surface and planarized to the level of the emitter layer, is etched down to the subcollector layer to define right and left base contact platforms which extend laterally from the emitter/base/collector layers. A function of the right and left base contact platforms is to reduce the extrinsic base-collector region. A dielectric mask is deposited to cover a portion of the sub-collector which is etched from the edge of the dielectric mask down to the substrate, forming a sub-collector mesa. An overhang is formed on the emitter cap layer to overhang the emitter layer. Also, an overhang is formed from the base/collector layers extended by the base contact platforms to overhang the upper portion of the subcollector. The overhangs are formed by anisotropic etching of the emitter layer and the upper portion of the sub-collector to undercut the emitter cap mesa and the right and left base contact platforms respectively. The dielectric covering the vertical walls of the emitter cap mesa and base contact platforms protects them during this anisotropic etch. The overhangs can be extended by forming sidewalls on the emitter cap mesa and the base contact platforms.

A metalization layer is then evaporated on the three mesa surfaces in one photoresist, evaporation and lift-off process. This forms an emitter contact on the emitter cap mesa, a base contact self-aligned to the emitter mesa overhang and a collector contact in alignment with the base/collector layer overhang. A polyamide is then deposited over the wafer surface and planarized by etch back to expose the emitter tops. Vias are etched through the polyamide to reach the base and collector contacts. Metal contacts are made through the vias to reach the base and collector contacts by patterning a metal layer over the polyimide.

BRIEF DESCRIPTION OF THE DRAWINGS

FIG. 1a–1l are sectional views showing successive steps in the formation of an HBT in accordance with this invention, the final HBT shown in FIG. 11.

DETAILED DESCRIPTION OF THE INVENTION

Figure 1A:
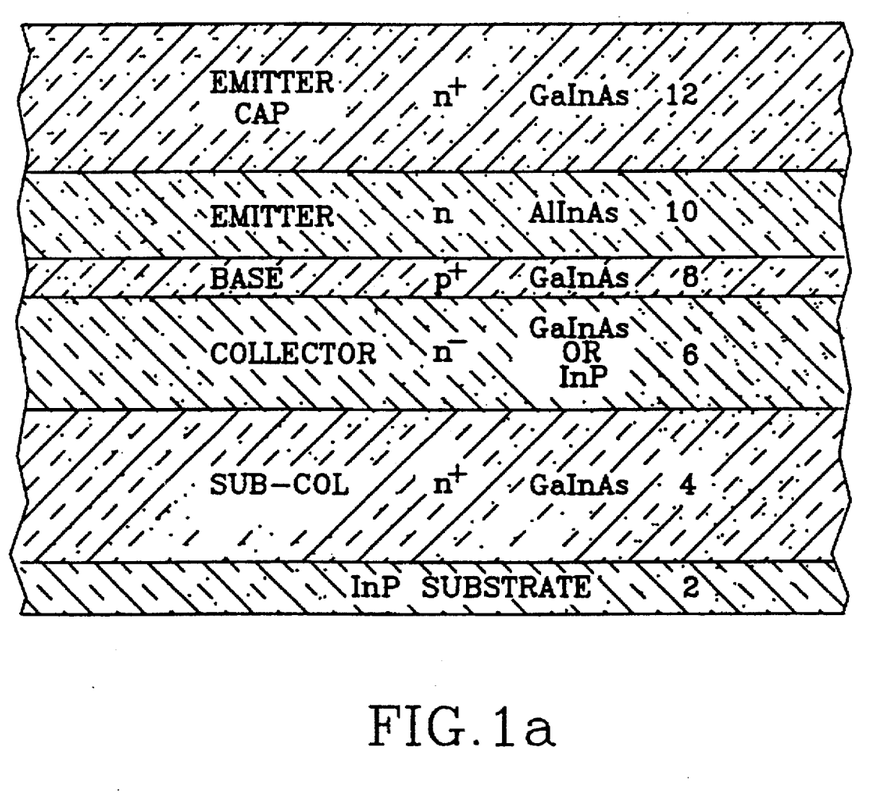

FIG. 1a is a cross-sectional diagram of a layered semiconductor structure from which an HBT in accordance with the present invention can be fabricated. The layers are preferably formed on a wafer substrate. The chemical makeup of the layers is either silicon or materials chosen from the III-V compound semiconductor group, which consists of many binary, ternary, and quaternary compound materials. The semiconductor material layers grown on the substrate 2 should be at least approximately lattice matched to the substrate 2. The preferred technique for lattice matching layers is molecular beam epitaxial growth (MBE). The speed performance, power usage, voltage usage, cost and integration complexity of the application for which the HBT is used will also influence the relation of the materials for the device. For example, InP based systems provide better speed and lower power usage than Si based systems, but are costlier to make.

In a preferred material system, the substrate 2 is InP. InP is a semi-insulating material. A sub-collector layer 4, epitaxially formed on the substrate 2, is made of GaInAs doped to approximately $1 \times 10^{19}$ cm$^{-3}$ and is approximately 3000–4000 Angstroms thick. A collector layer 6, epitaxially formed on the subcollector 4, is either GaInAs or InP, lightly doped at approximately $1 \times 10^{16}$ cm$^{-3}$, and is approximately 1500–3000 Angstroms thick. InP has a wider bandgap than GaInAs and by implementing an InP collector, a higher base-collector breakdown voltage is obtained then for a GaInAs collector. The breakdown voltage can be manipulated according to the power supply of the application for which the HBT is used. For example, low power circuits such as hand held portable electronics and battery powered devices require low breakdown voltages. The breakdown voltage is also increased as the collector 6 doping is decreased or its thickness increased.

A GaInAs base layer 8, doped at approximately $1–5\times 10^{19}$ cm$^{-3}$ with beryllium or other p-type dopants is epitaxially formed on the collector 6 and is approximately 200–500 Angstroms thick. The base 8 is made intentionally thin relative to other layers in the HBT structure to limit the base transit time and base recombination. An AlInAs emitter layer 10, doped at approximately $7 \times 10^{16}$ cm$^{-3}$ with Si, is epitaxially formed on the base 8 and is approximately 600–1200 Angstroms thick. AlInAs has a wider bandgap than GaInAs or InP, creating a heterojunction at the base-emitter junction and suppressing the reverse hole flow into the emitter 10. The reverse flow of holes is further suppressed by compositional grading of the emitter 10 at the emitter-base junction which decreases the barrier for electrons flowing from the emitter to the base and increases the barrier for holes flowing in the opposite direction. An emitter cap 12, preferably of GaInAs with a doping concentration of about $1 \times 10^{19}$ cm$^{-3}$ and approximately 4000–6000 Angstroms thick, is formed over the emitter 10. The emitter cap 12 is heavily doped to provide a low resistance contact to the emitter 10. Furthermore, it is made thick to compensate for a thin emitter contact that is later deposited on its top surface, and to ensure that the emitter contact is higher above the substrate than a planarizing polyimide layer to be deposited and etched back over the substrate in a final planarization step.

Two other exemplary material systems are a GaAs substrate with an AlGaAs emitter, and a Si substrate HBT with a SiGe base. In the GaAs and Si material systems, the general doping level of each layer is indicated in FIG. 1a. For example, the subcollector 4 would be a highly doped n type material (n+) while the collector 6 would be a lightly doped n type material (n−). The structure of FIG. 1a is an npn HBT. However, the conductivity of the various regions can be changed through different doping to produce a pnp HBT.

Figure 1B:
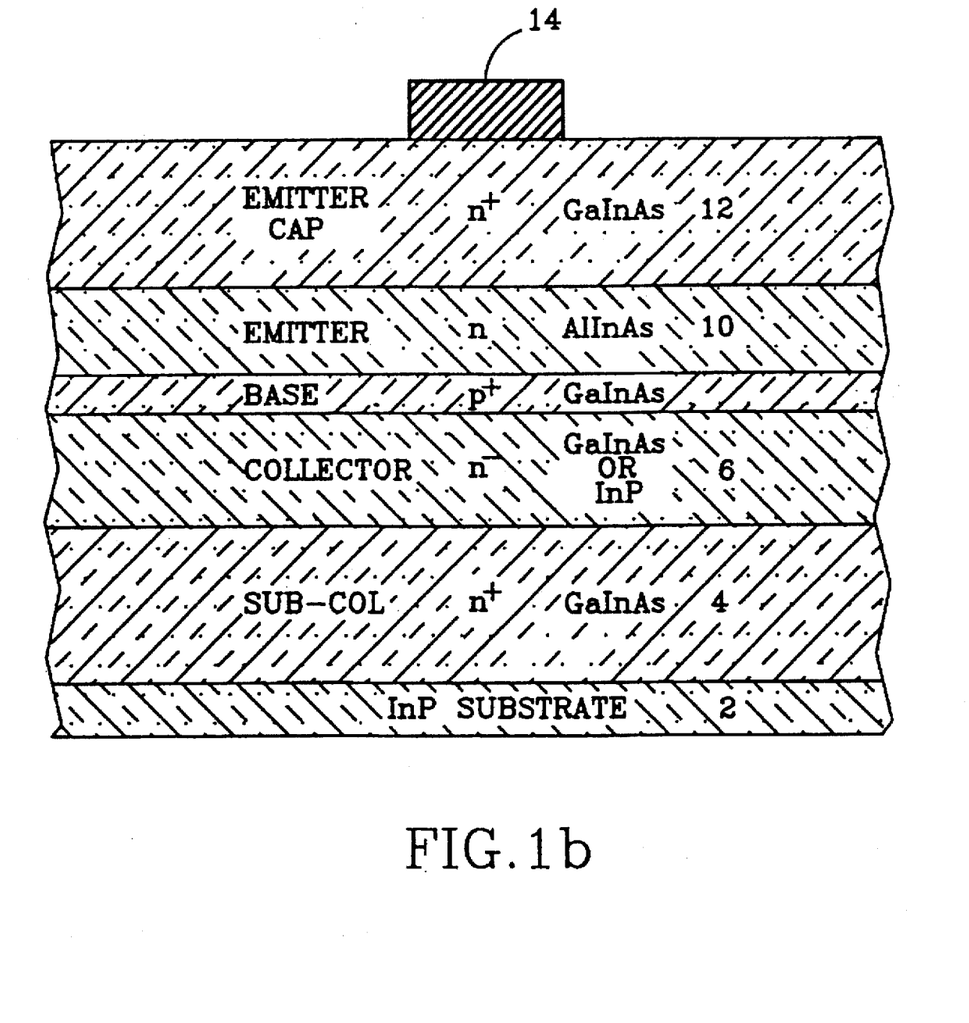

Once the semiconductor layers are formed, the emitter cap 12 is coated with a mask made of either a thin dielectric layer approximately 1000–2000 Angstroms thick, or a thin Ti layer approximately 500–1000 Angstroms thick. Preferred dielectrics are SiO$_2$ and SiO$_3$N$_4$. Two methods of depositing the mask include plasma enhanced chemical vapor deposition (PECVD) and evaporation. Once the emitter cap is coated, the emitter cap pattern is defined in a thin layer of photoresist approximately 3000–5000 Angstroms thick. The photoresist emitter cap pattern is then transferred to the dielectric or Ti mask using reactive ion etching (RIE). FIG. 1b shows a dielectric emitter cap pattern mask 14 formed on the emitter cap 12 Because the emitter cap pattern is defined in a thin layer of photoresist, submicron features are easily and reproducibly fabricated and transferred to form the emitter cap pattern mask 14.

Figure 1C:
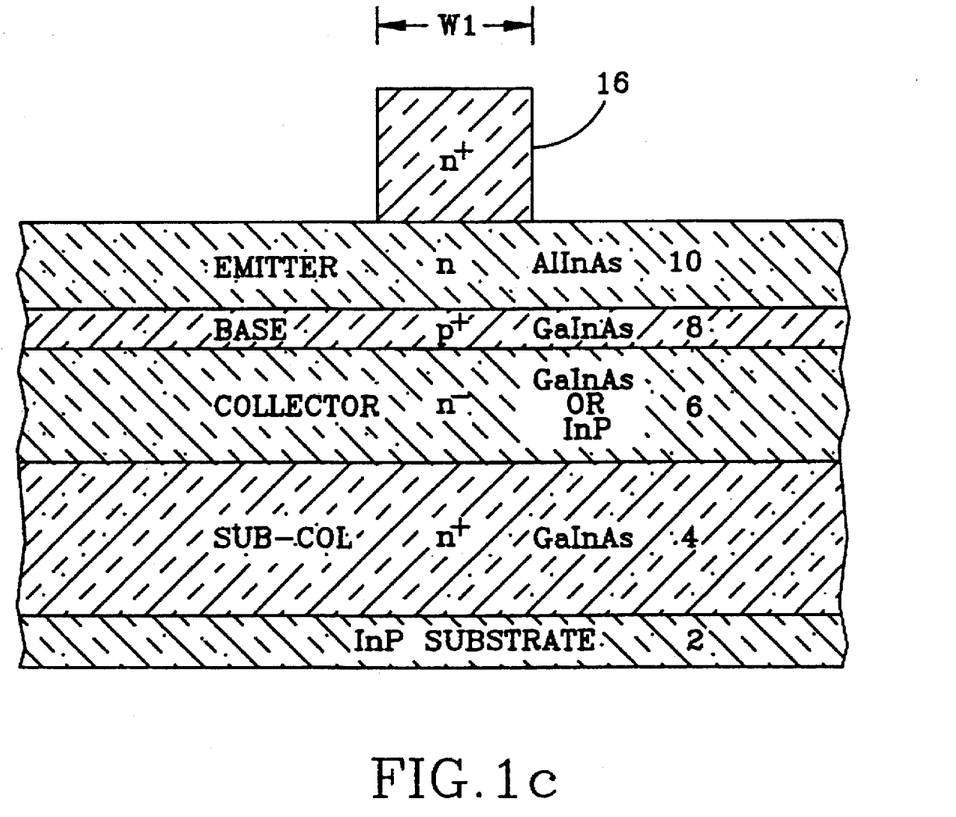

Referring to FIG. 1c, after forming the emitter cap pattern mask 14, the emitter cap 12 is isotropically etched down to the emitter layer 10 and the mask is removed by a wet etch removal technique such as buffered oxide etch (BOE) or a dry etching technique such as RIE, to form an emitter cap mesa 16. The width of the emitter cap mesa 16, W1, is of submicron dimensions. RIE, which involves both a bombardment of ions and chemical reactions between ions and the surface to be etched, is the preferred method of etching the emitter cap 12 because a nearly vertical etch is made with little undercut. This is important when forming submicron features. Furthermore, the RIE plasma of $CH_4/H_2/Ar$ is selective and slows down the etching at the AlInAs emitter layer 10.

Figure 1D:
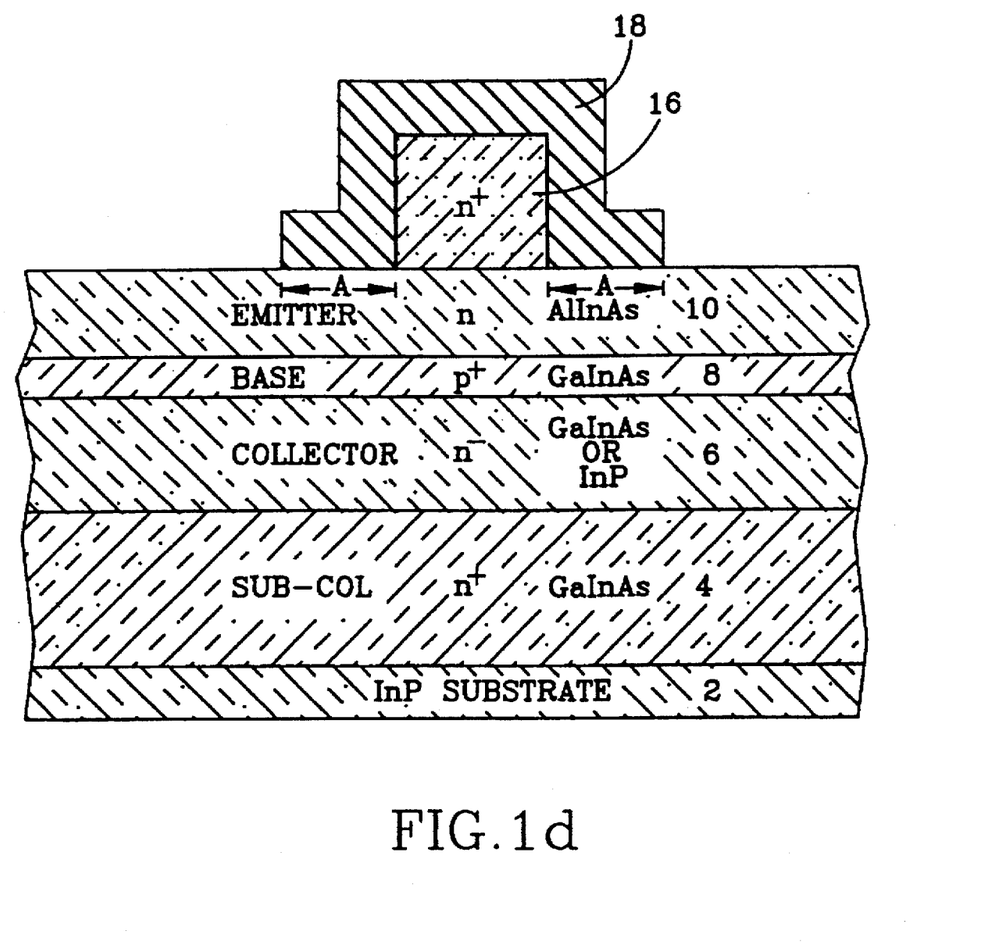
Figure 2:
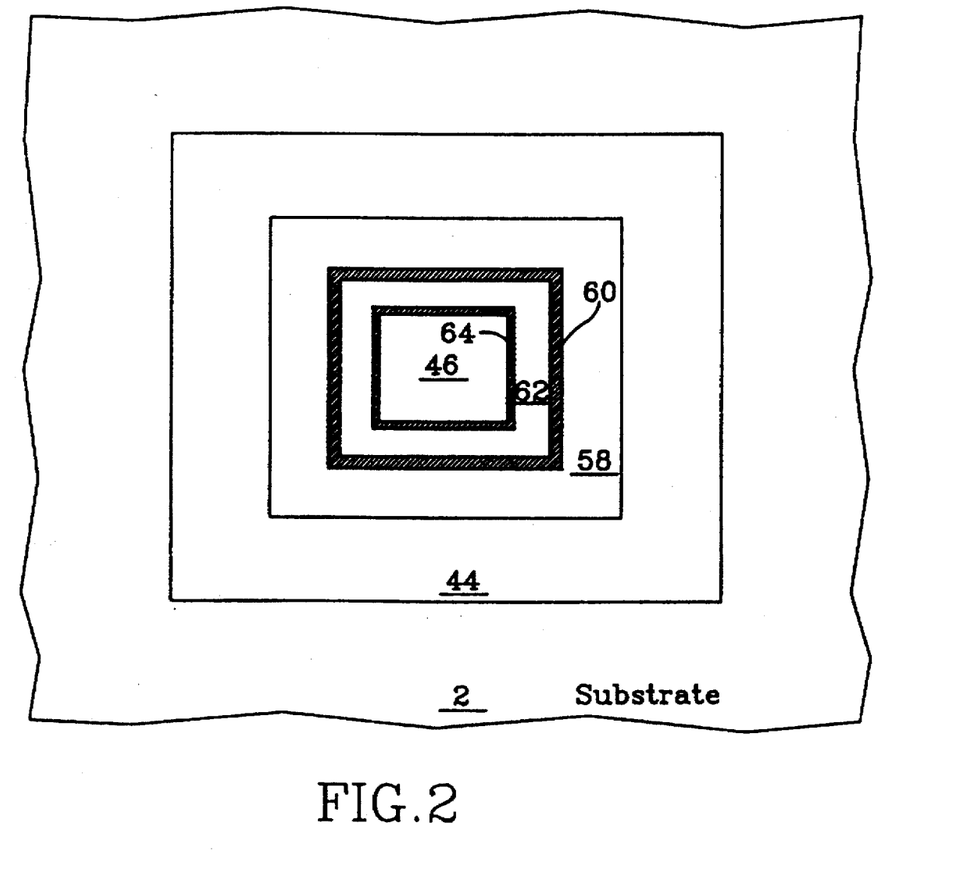
FIG. 2 is a plan view of the HBT.

Referring to FIG. 1d, a thin dielectric base pattern mask 18 is formed on the emitter cap mesa 16 using similar deposition, photoresist and etching techniques as used in forming the emitter cap pattern mask 14 of FIG. 1b. The base pattern mask 18 is preferably composed of $SiO_2$ or $Si_3N_4$, approximately 1000-2000 Angstroms thick. The base pattern mask 18 extends beyond the emitter cap mesa 16 by a distance A from both its right and left sides as shown in FIG. 1d. A is approximately 0.5-0.7 microns. Reference is made to the right and left sides of the emitter cap mesa 16 for ease of referring to FIG. 1d which is a sectional diagram. The various layers of the HBT are actually four sided with the boundaries of a wider layer extending beyond the boundaries of a narrower layer on all sides (FIG. 2 is a plan diagram showing the patterned layers of the HBT).

Figure 1E:
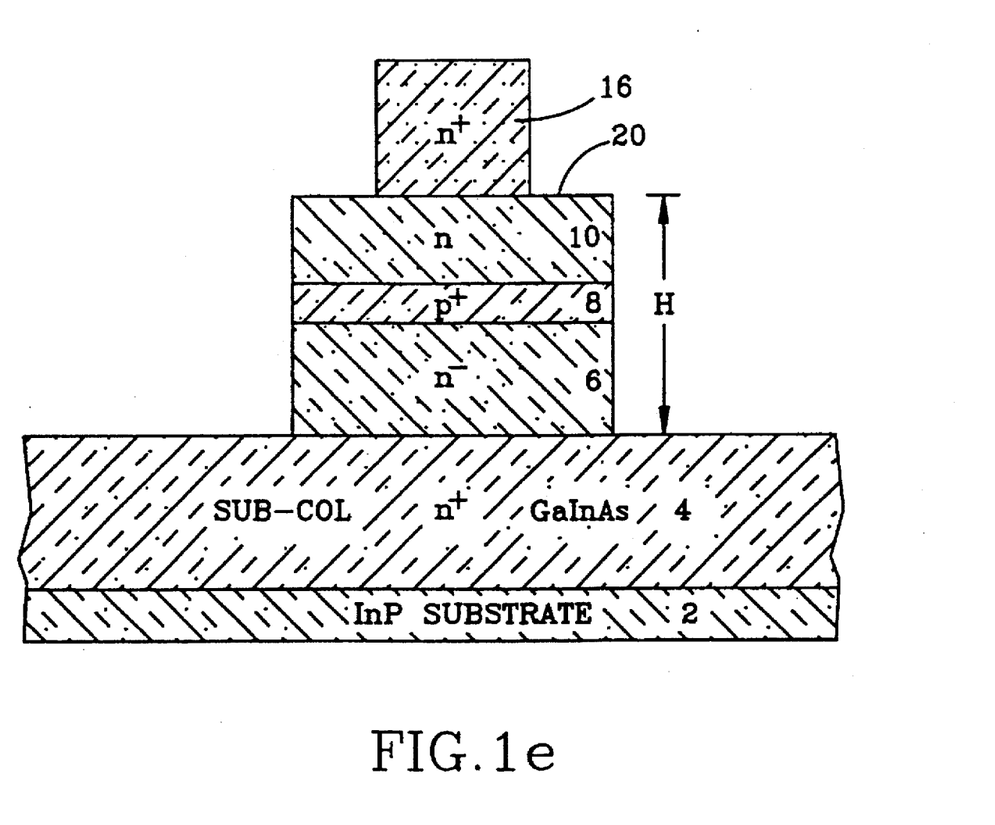

Once the base pattern mask 18 is formed, the emitter, base and collector layers, 10, 8 and 6 respectively, are isotropically etched down to the sub-collector layer 4, preferably by $CH_4/H_2/Ar$ RIE. This forms a mesa out of the emitter, base and collector layers. Since the subcollector is heavily doped, probing the surface of the subcollector layer 4 can be used as an end point detector for etching. The exact end-point of the RIE for this step is not very critical. Once the etching is completed, the base pattern mask 18 is removed by a wet or dry etch removal technique. The remaining structure, shown in FIG. 1e, includes the emitter/base/collector mesa 20 with a height H below the narrower emitter cap mesa 16.

Figure 1F:
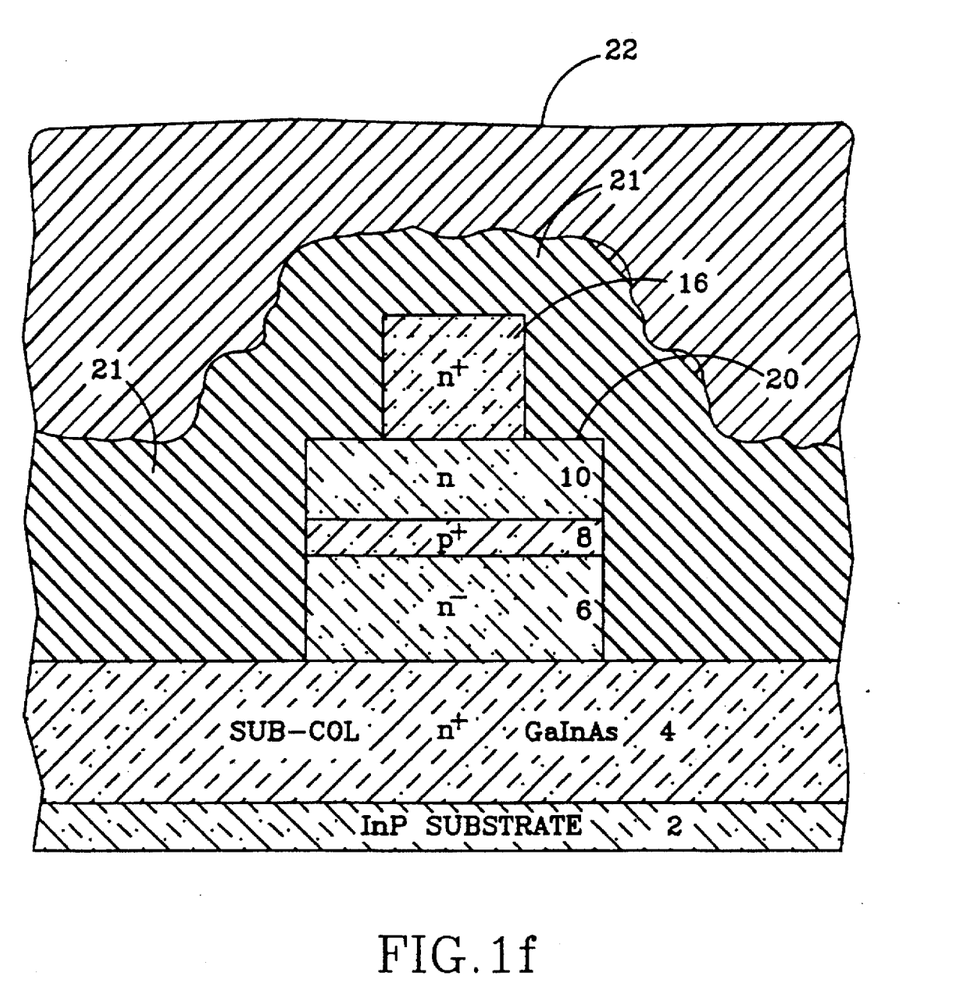
Figure 1G:
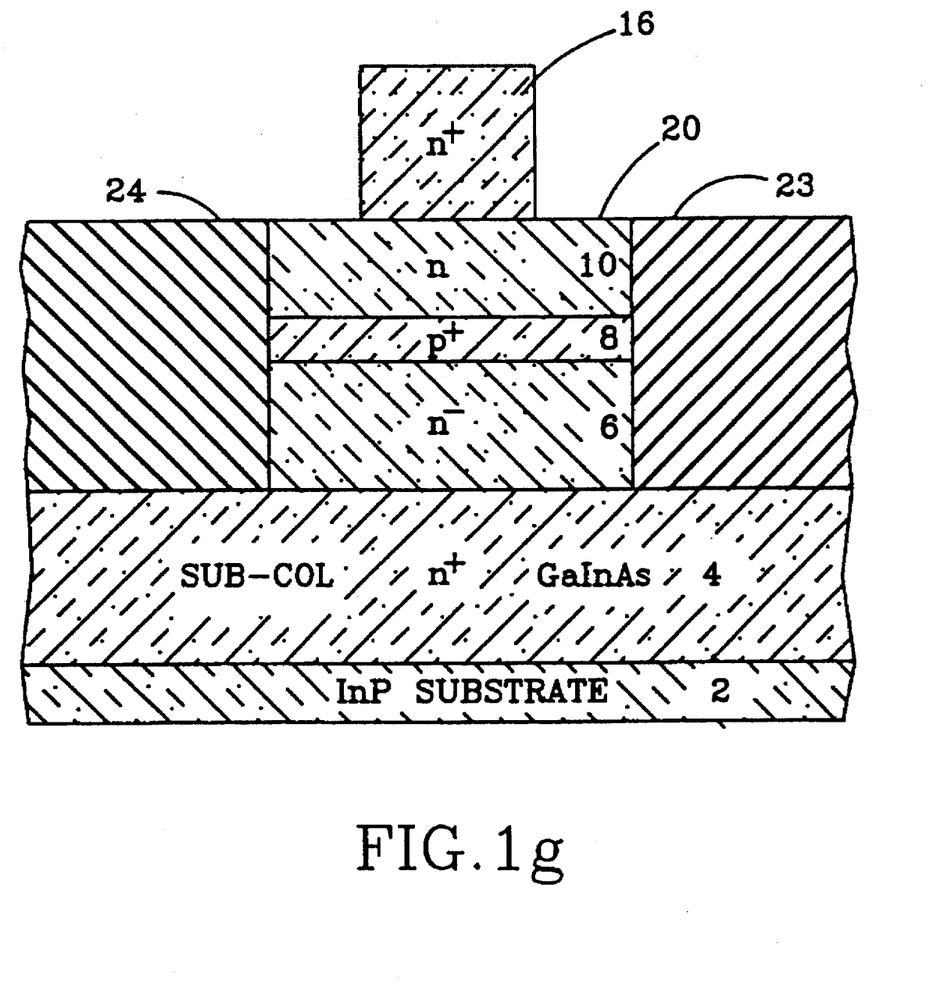

Referring to FIG. 1f, once the emitter/base/collector mesa 20 is formed, a dielectric 21 is deposited over the wafer up to the level of the emitter 10. In a III-V compound system, the preferred method is PECVD deposition of $SiO_2$. Once the dielectric is deposited, a thick (approximately 3-5 microns) polymer layer 22 such as a photoresist or polyimide with a planarizing property is spun on the surface of the wafer covering the emitter cap mesa 16. The polymer 22 and the dielectric 21 are then etched down to level of the emitter 10, exposing the surface of the emitter layer 10 as shown in FIG. 1g. RIE using $CF_4/O_2$ is the preferred method of etching when the dielectric is $SiO_2$. The RIE conditions are controlled to etch the polymer and $SiO_2$ at the same rate. The etching forms right and left planarized dielectric layers, 23 and 24 respectively.

Figure 1H:
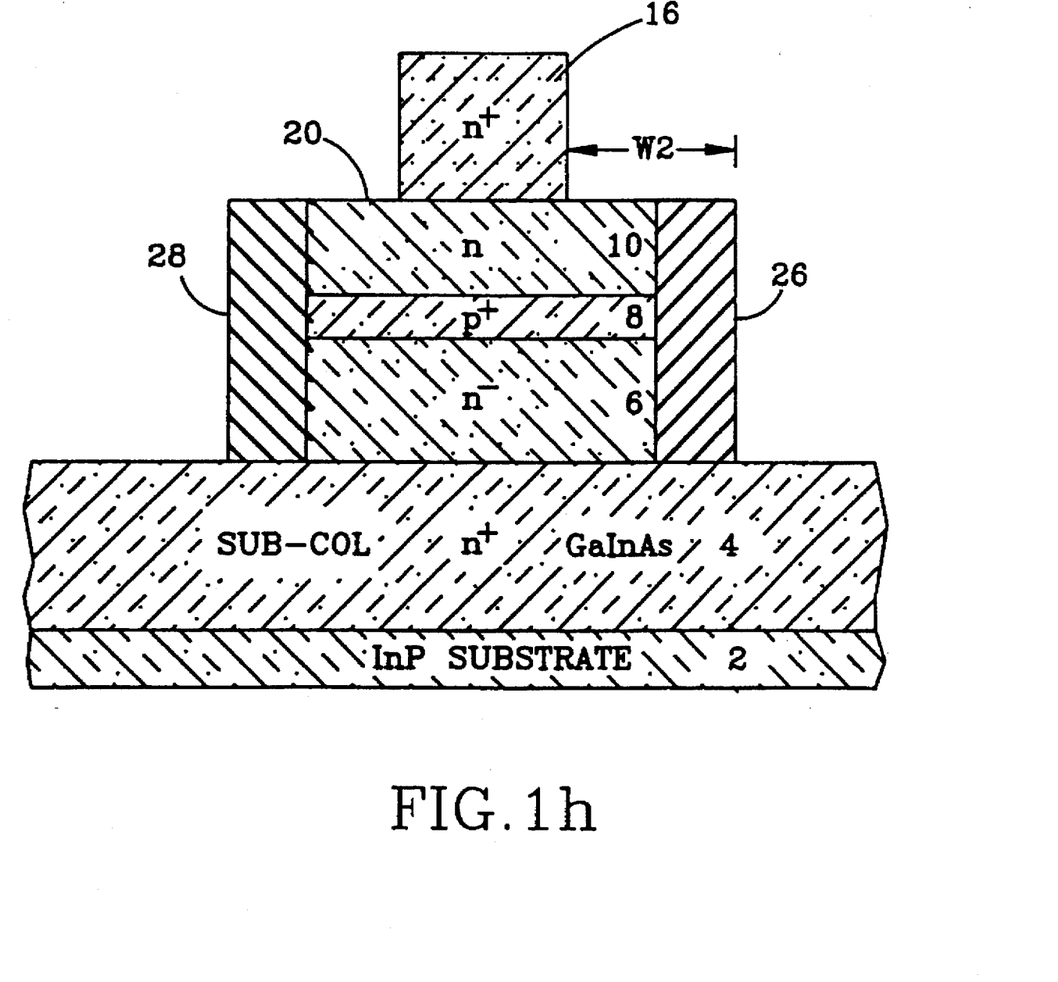

A base contact platform mask is then deposited over the emitter cap mesa 16 and emitter layer 10 extending approximately 2 microns over the right dielectric layer 23. The extent the base contact platform mask extends over the left dielectric layer 24 is not significant, but should not exceed 1.0 microns. Techniques similar to those used in forming the emitter cap pattern mask and base pattern mask are used for the base contact platform mask. The right and left dielectric layers, 23 and 24 respectively, are then isotropically etched down to the subcollector layer 4 and the base contact platform mask is removed. RIE is the preferred method of etching. Referring to FIG. 1h, the resulting structure includes the emitter/base/collector mesa 20, a right base contact platform 26 which extends laterally from the right side of the emitter/base/collector mesa 20 and a left base contact platform 28 which extends laterally from the left side of the emitter/base/collector mesa 20.

The effect of the right and left base contact platforms, 26 and 28 respectively, is to extend the width of the FIG. 1h structure at the emitter, base, and collector layers 10, 8 and 6 respectively. W2 is the combined width of the right base contact platform 26 and the portion of the emitter/base/collector layers to the right of the emitter cap mesa 16 and is preferably about 2.5-2.7 microns wide. The base contact platform extensions enlarge the surface on which a base contact can be made (shown in later steps) without extending the extrinsic portion of the transistor. The width of the base and collector layers, 8 and 6 respectively, and their junction capacitance can therefore be limited. The extension of the base and collector layers, 8 and 6 respectively, is also used in forming over hangs in a later step. For forming overhangs, the emitter, base and collector layers, 10, 8 and 6 respectively, could also be widened by making a wider etch in the earlier steps of forming the emitter/base/collector mesa 20. This would eliminate the steps just described in forming the base contact platforms. The preferred embodiment, however, includes the right and left base contact platforms, 26 and 28 respectively, to substantially reduce the base-collector junction capacitance and still provide a wide enough surface for a base contact.

Figure 1I:
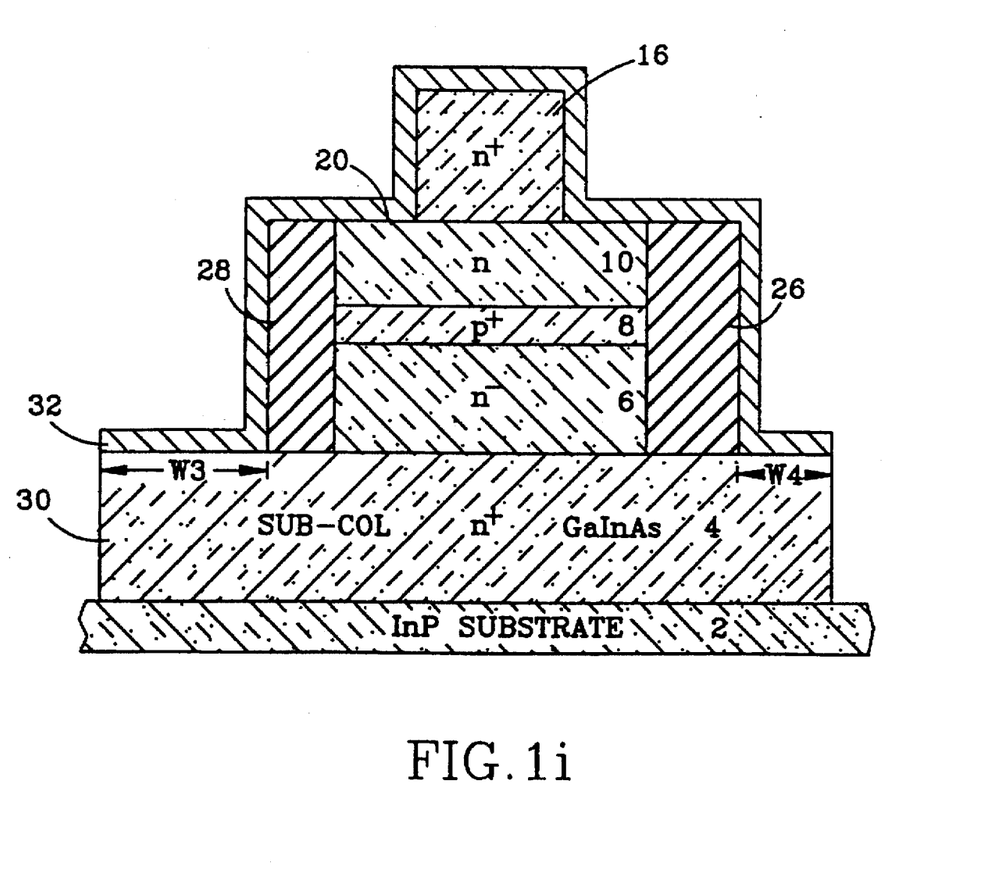

Once the base contact platforms are formed, a dielectric mask 32, shown in FIG. 1i, is deposited over the wafer. The dielectric is preferably an oxide or nitride and is approximately 2000-3000 Angstroms thick. It is patterned with an isolation mask, using RIE, and used for etching the subcollector 4 down to the semi-insulating InP substrate 2, again preferably using RIE. The InP substrate 2 is probed as an end-point etch detector, although the exact end-point of this RIE is not critical. The resulting structure after etching of the subcollector includes a subcollector mesa 30 formed from the subcollector layer 4 (dielectric mask 32 is not removed in FIG. 1i). The subcollector mesa 30 functions as an isolation mesa on the InP substrate 2 and extends beyond the base contact platforms 26 and 28 by an amount W3 equal to approximately 2-3 microns on their left side and an amount W4 equal to approximately 1-2 microns on their right side. The left side is made wider to provide room for access by way of a via to the subcollector layer 4 in a subsequent step.

Figure 1J:
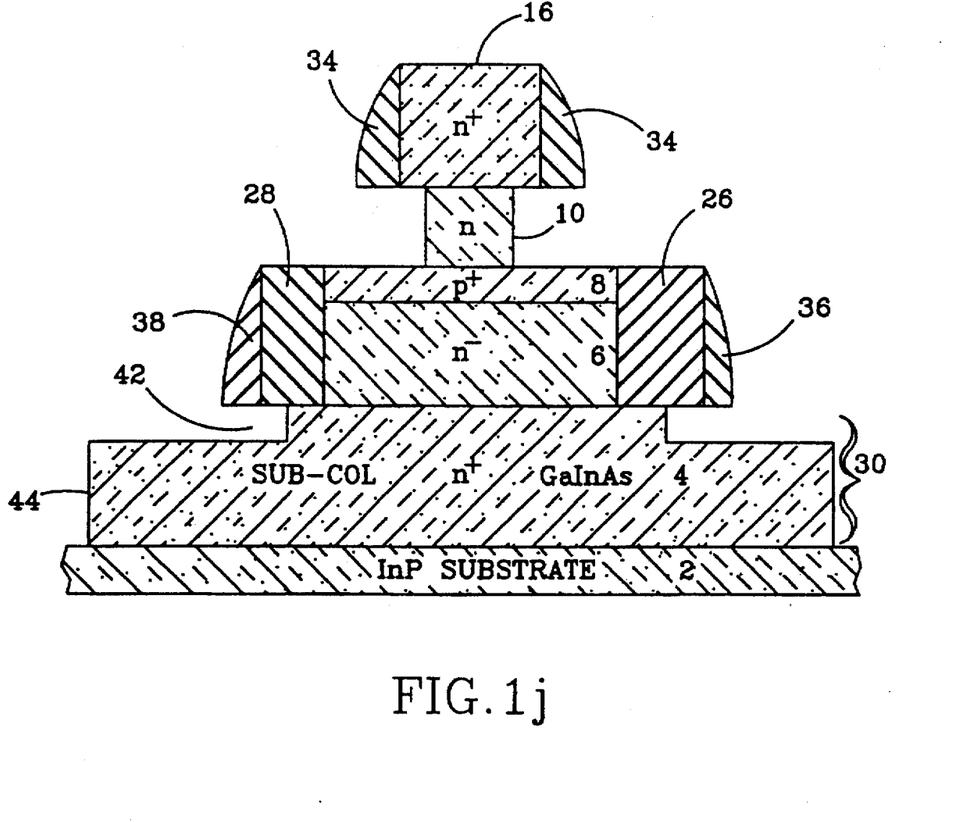

Referring to FIG. 1j, the dielectric mask 32 is etched to leave emitter cap sidewalls 34 and right and left base contact platform sidewalls, 36 and 38 respectively. RIE is the preferred etching method and, by controlling the gas ratios of ions, the flow rate of ions, the chamber pressure and power/voltage applied to accelerating ions among other factors, the RIE rate is controlled to form tapered sidewalls.

Once the sidewalls are formed, an overhang is formed on the emitter cap mesa 16 to overband the emitter layer 10. This is performed through an anisotropic etch which reduces the width of the emitter layer 10 to undercut the emitter cap mesa 16. At the same time an overhang is also formed on the base/collector layers, 8 and 6 respectively, to overhang the upper subcollector portion 42. This is performed through an anisotropic etch which reduces the width of the upper subcollector portion 42 to undercut the base/collector layers. In the preferred embodiment, the base/collector layers are extended by base contact platforms 26 and 28. Therefore, the undercut of the upper subcollector portion 42 is made under the base contact platforms 26 and 28. A citric based wet chemical etch is the preferred anisotropic etch.

In the preferred embodiment, as shown in FIG. 1j, the emitter layer 10 undercut and sidewalls 34 function together to establish an overhang on the emitter cap mesa 16. Similarly, the upper subcollector portion 42 undercut and the sidewalls 36 and 38 function together to establish an overhang on the base/collector layers, 8 and 6. In another embodiment, the overhangs can be formed by the undercuts alone without sidewalls.

The purpose of creating an overhang from one layer to another is to break a metalization layer deposited over the two layers at the overhang. A break in the metal allows the formation of metal contacts to two surfaces without a short between the contacts. Two contacts, typically formed in two metalization steps, are thus formed in one metalization step. The advantage of forming multiple contacts in one metalization step is that the contacts will be self-aligned with the lateral distance between them determined by approximately the width of an overhang and not the alignment errors which result from multiple metalization steps.

Figure 1K:
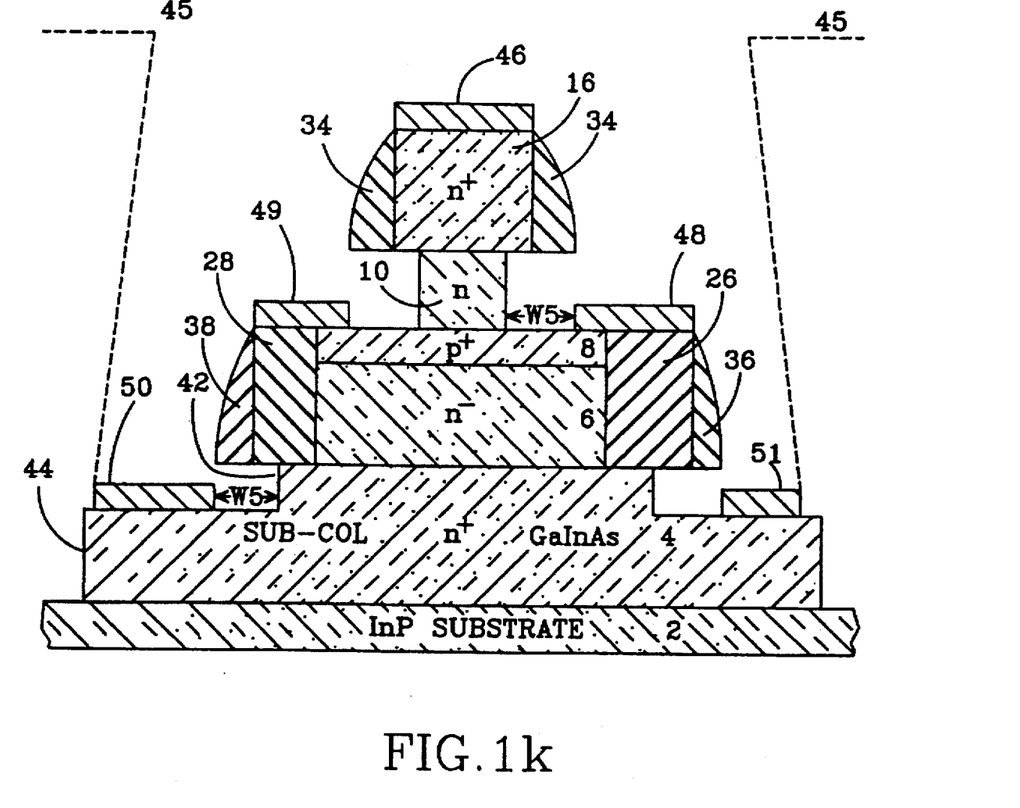

Referring to FIG. 1k, once overhangs are formed, self-aligned metal contacts are made to the emitter cap mesa, the base layer and the lower subcollector portion, 16, 8 and 44 respectively. This is accomplished by defining photoresist openings 45 on the upper surface of the lower subcollector portion 44 lateral to the base contact platforms, and evaporating an ohmic metal layer over the wafer to a thickness of approximately 1000–1500 Angstroms. The metal is preferably a Ti/Pt/Au system which provides good ohmic contacts to all three layers.

Once the metal layer is deposited, the photoresist layer is lifted off along with any excess metal. The emitter cap mesa 16 overhang acts as a mask which makes a break in the metal. The break forms an emitter cap metal contact 46 which serves as the contact to the emitter layer 10 through the emitter cap mesa 16. It also forms a right base metal contact 48 on the base layer 8 and the right base contact platform 26 surfaces (right base metal contact 48 is contacted through a via from the surface of the resulting HBT in a later step; left base metal contact 49, formed on the base layer 8 and the left base contact platform 28 surfaces, is not contacted). The base/collector layer overhang also acts as a mask to break the metal. This forms left and right collector contacts, 50 and 51 respectively, on the lower subcollector portion 44 (left collector contact 50 is contacted through a via from the surface of the resulting HBT in a later step; right collector contact 51 is not contacted). All contacts are formed simultaneously in one evaporation process.

The critical edges of the base contacts 48 and 49 are therefore defined by the emitter layer 10 undercut and sidewalls 34 and the critical edges of the collector contacts 50 and 51 are defined by the upper subcollector portion 42 undercut and sidewalls 36 and 38. This results in contacts which are self-aligned to the emitter cap mesa 16, with the right base contact 48 and left collector contact 50 spaced approximately 0.1–0.2 microns from the emitter layer 10 and from the upper subcollector portion 42 respectively. Both spacings are indicated by W5 and are very small relative to the spacings associated with multiple metalization steps which have tolerances in the order of 1.0 microns. The small spacing of W5 limits the lateral contact resistance. The lateral contact resistance is the resistance from the base or collector contacts to the intrinsic portion of the HBT which lies under the emitter layer 10. By limiting the lateral contact resistance, the parasitic resistance of the HBT is limited and its frequency response improved.

Following the formation of metal contacts, a polyimide layer 52 is deposited to planarize the wafer, as shown in FIG. 1l. The polyimide layer 52 is etched down, preferably by RIE, to expose the emitter cap contact 46. This results in easy access for contact to the emitter. Vias 54 and 56 are then etched through the polyimide layer 52 to respectively reach the right base metal contact 48 and the left collector metal contact 50. An interconnect metal is then patterned and deposited over the wafer providing electrical access to the device's terminals from the polyimide surface. This forms an emitter interconnect metal contact 57a to the emitter cap contact 46 and fills vias 54 and 56 with interconnect metals 57b and 57c respectively. FIG. 2 is a plan view of the HBT structure of FIG. 1k. The substrate 2 surrounds the subcollector mesa's lower portion 44. The collector contact 58 surrounds the base contact platform sidewall 60. The base contact platform sidewall 60 corresponds to right and left base platform contact sidewalls, 36 and 38 respectively, of FIG. 1k. The base contact 62 surrounds the emitter cap mesa sidewall 64 which corresponds to the emitter cap mesa sidewall 34 of FIG. 1k. The emitter contact 46 is positioned in the middle of the surrounding layers.

While particular embodiments of the invention have been shown and described, numerous variations and alternative embodiments will occur to those skilled in the art. Accordingly, the invention is intended to be limited only in terms of the appended claims.

I claim:

1. A heterojunction bipolar transistor (HBT), comprising:

a semiconductor substrate, a semiconductor subcollector layer formed on said substrate, said subcollector having an upper portion and a wider lower portion with respective surfaces, a semiconductor collector layer on said upper subcollector portion and having lateral edges recessed from the lateral edges of said subcollector upper portion, a semiconductor base layer formed on said collector layer, said base layer establishing a junction with said collector layer that is smaller than said upper subcollector portion, a dielectric base contact platform formed on and overhanging said upper subcollector portion but spaced inward from said lower subcollector portion, an emitter layer formed on said base layer of a semiconductor material with a wider bandgap than said base layer semiconductor, said emitter layer having a submicron width and positioned inward from said base layer, a semiconductor emitter cap layer formed on and overhanging said emitter layer, an emitter contact formed on the surface of said emitter cap layer, a base contact formed on said base layer and said dielectric base contact platform in alignment with said emitter cap layer, and a collector contact formed on said lower subcollector portion in alignment with said base contact platform.

2. The HBT of claim 1, further comprising insulating sidewalls formed on the sides of said emitter cap and on the sides of said right and left base contact platforms.

* * * * *